United States Patent [19]
Park et al.

[11] Patent Number: 5,229,325
[45] Date of Patent: Jul. 20, 1993

[54] METHOD FOR FORMING METAL WIRINGS OF SEMICONDUCTOR DEVICE

[75] Inventors: Jong-Ho Park; Deok-Min Lee; Sang-in Lee, all of Kyunggi, Rep. of Korea

[73] Assignee: Samsung Electronics Co., Ltd., Kyunggi, Rep. of Korea

[21] Appl. No.: 758,603

[22] Filed: Sep. 12, 1991

[30] Foreign Application Priority Data

Jan. 31, 1991 [KR] Rep. of Korea ............. 91-1861[U]

[51] Int. Cl.⁵ .................................. H01L 21/441
[52] U.S. Cl. .................................. 437/187; 437/190; 437/194; 437/195
[58] Field of Search ............. 437/190, 187, 976, 194, 437/192, 195

[56] References Cited

U.S. PATENT DOCUMENTS

| | | | |
|---|---|---|---|
| 4,400,865 | 8/1983 | Goth et al. | 437/31 |
| 4,424,621 | 1/1984 | Abbas et al. | 437/51 |
| 4,789,648 | 12/1988 | Chow et al. | 437/228 X |
| 4,966,867 | 10/1990 | Crotti et al. | 437/195 |
| 5,104,826 | 4/1992 | Fujita et al. | 437/192 X |

FOREIGN PATENT DOCUMENTS

| | | |
|---|---|---|
| 43942 | 1/1982 | European Pat. Off. |
| 83089 | 7/1983 | European Pat. Off. |
| 224013 | 6/1987 | European Pat. Off. |
| 365492 | 4/1990 | European Pat. Off. |
| 3614793 | 11/1986 | Fed. Rep. of Germany |

OTHER PUBLICATIONS

A. Rey et al., "A Double Level Aluminum Interconnection Technology With Spin on Glass Based Insulator", Proceed of the Third Int. IEEE VLSI-MIC Conf., Jun. 9-10, 1986, pp. 491-499.

*Primary Examiner*—John S. Maples
*Attorney, Agent, or Firm*—Cushman, Darby & Cushman

[57] ABSTRACT

A method for forming metal wires of a semiconductor device includes the steps of first forming about half of the total metal wires, the wires being arranged at regular intervals, forming sidewall spacers made of insulating materials on the metal wires using an etchback method, and forming the rest of the total wires at spaces between the wires of the first half, again using an etchback process. This results in a wire structure in which a gap between adjacent metal wires is about 0.1 microns in width.

14 Claims, 4 Drawing Sheets

METHOD FOR FORMING METAL WIRINGS OF SEMICONDUCTOR DEVICE

BACKGROUND OF THE INVENTION

1. Field of the Invention

The present invention relates to a method for forming metal wires of a semiconductor device, and particularly to a method for forming metal wires of very-large-scale integration (VLSI) semiconductor devices having metal wire pitches at submicron dimensions.

2. Description of Related Art

Recent developments in miniaturization techniques at submicron dimensions have facilitated rapid and remarkable increases in the integration density of semiconductor memory devices. For example, 4 Mbit DRAMs of 0.8 micron design scale are now in manufacture. 16 Mbit DRAMS of similar design scale are also about to be mass produced. In addition, 64 Mbit and 256 Mbit DRAMS of 0.5 micron design scale are presently under active study. These advanced designs in VLSI semiconductor memory devices require the use of multiple metal layering process for forming metal wires.

Conventionally, metal wires are produced by the following general steps: introducing contact holes on the surface of a material covering a semiconductor; body forming metal wires; and covering the surface of the semiconductor body with a passivation film.

FIGS. 1A-1D are cross-sectional structural diagrams of a semiconductor device at various stages in the above-described process. Inter-insulating layer 2 is layered to cover semiconductor substrate 1. Next, contact hole 3 is created in inter-insulating layer 2. Subsequently, barrier layer 4, made of a refractory metal such as an aluminum or aluminum alloy, is blanketed over the entire surface of layer 2. Next, metal layer 5 is deposited over barrier layer 4 a by sputtering or chemical vapor deposition (CVD) method. A photoresist is placed over metal layer 5, following which photoresist pattern 6 is formed via photolithography. Metal wires 7 in FIG. IC are then formed by etching metal layer 5 and barrier layer 4, using photoresist pattern 6 as a mask. Subsequently, as illustrated in FIG. ID, the resulting structure is coated with passivation film 8, which may consist of material such as phosphor-silicate glass (PSG) or borophosphorous-silicate glass (BPSG).

In the above procedure, metal layer 5 is etched via lithography to form metal wires prior to being coated with passivation film 8. This implies that as the distance between two adjacent metal wires 7 is narrowed (e. g., to submicron dimensions), the aspect ratio of the groove between two adjacent metal wires becomes larger. Thus, the narrowing of the grooves leads to creation of voids 23 during the coating of passivation film 8. In addition, the surface of passivation film 8 becomes rough and uneven because of "stepped" structure of metal wires 7. The uneven surface of passivation film 8 and voids 23 decrease the robustness of metal wires 7 and renders the subsequent processing of semiconductor devices difficult. The defects may even cause disconnections of or short between metal wires.

SUMMARY OF THE INVENTION

It is an object of the present invention to provide a method for forming metal wires of a semiconductor device having wire pitches about a half-micron, without introducing the problems associated with the conventional method.

It is another object of the present invention to provide a method for forming metal wires of a semiconductor device with a relatively planar surface for the subsequent processing thereto.

According to the present invention, the method for forming metal wires of the semiconductor devices comprises the steps of: creating contact holes in a first insulating layer formed on a semiconductor substrate; forming a first smooth metal layer on the entire surface of the insulating later after the holes have been formed; forming one set of metal wires by an application of photolithography to the first metal layer; forming sidewall spacers of a second insulating layer on the side surfaces of the first set of metal wires and etching the first insulating layer between the sidewall spacers to an even depth; forming a second smooth metal layer on the entire surface of the structure which results from the preceding step; and forming a second set of metal wires by an application of anisotropic etching process to the smooth second metal layer. The combination of the first and the second groups of metal wires forms the complete wiring structure for the semiconductor device.

In the above described process, because the widths of the sidewall spacers can be made very small, it is possible to obtain metal wires with inter-wire distances down to approximately 0.1 micron, without voids 23 and unevenness on the surface of passivation film 8.

BRIEF DESCRIPTION OF THE DRAWINGS

The above and other objects and advantages of this invention will become more apparent and more readily appreciated from the following detailed description of the presently preferred exemplary embodiments of the invention, taken in conjunction with the accompanying drawings, of which.

DETAILED DESCRIPTION OF THE PRESENTLY PREFERRED EXEMPLARY EMBODIMENT

Figure 1A:
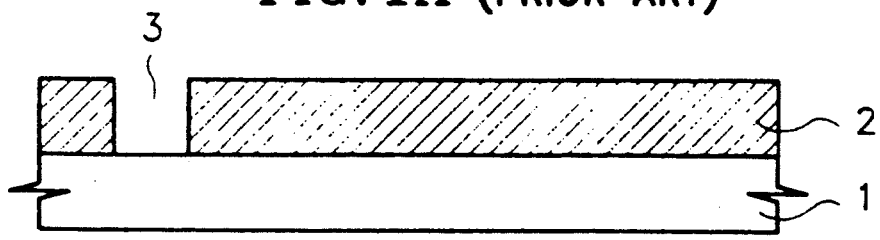
FIGS. 1A-1D show cross-sectional structural diagrams of a semiconductor device at various stages in the conventional process for forming metal wires of the semiconductor device.
Figure 1B:
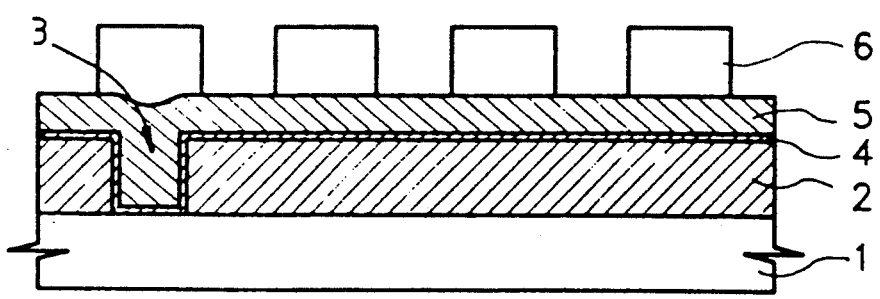
Figure 1C:
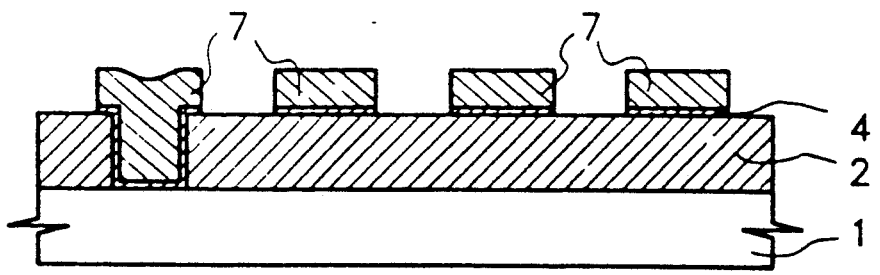
Figure 1D:
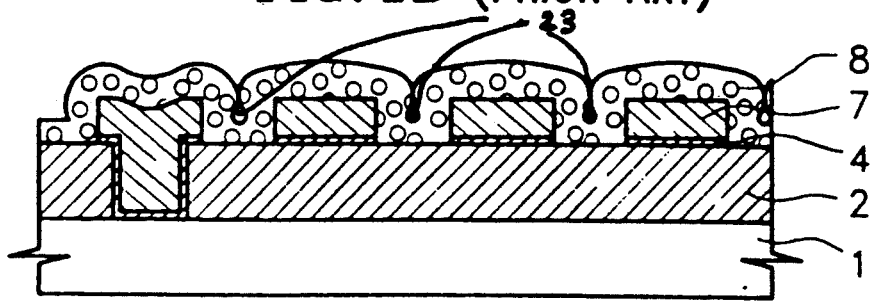
Figure 2A:
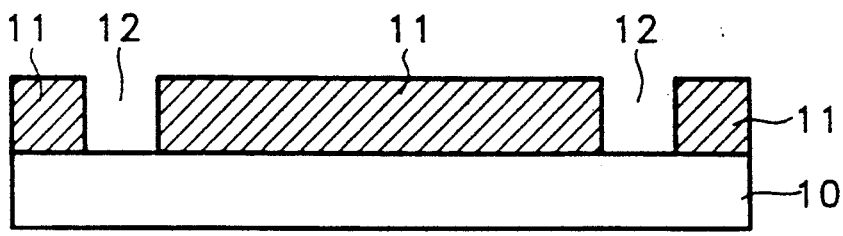
FIGS. 2A-2I show cross-sectional structural diagrams of a semiconductor device at various stages in the method for forming metal wires of the semiconductor device, in accordance with the detailed description of the preferred embodiment of the present invention.

As illustrated in FIG. 2A, the method for forming metal wires begins with laying first insulating layer 11 (i. e., oxide layer) over semiconductor substrate 10. Next, contact holes 12 are hollowed out in first insulating layer 11.

Figure 2B:
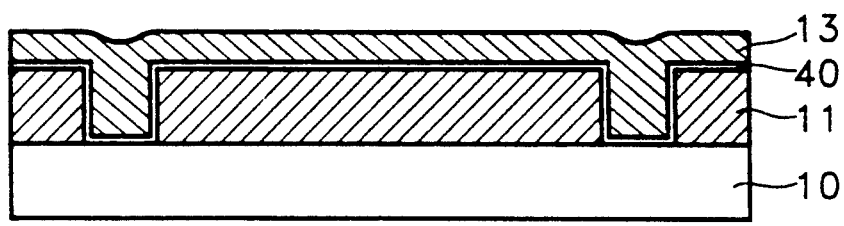

Subsequently, an aluminum alloy (i. e, aluminum mixed with Si, Cu, Ti, Pd, Hf, or B) is deposited on layer 11 through sputtering or the CVD method, thus completely filling up holes 12. This process places first metal layer 13 on the top of insulating layer 11, as shown in FIG. 2B. Barrier layer 40 comprising a refractory metal or a silicide of a refractory metal such as titanium/titanium nitride (Ti/TiN), molybdenum silicide (MoSix), titanium tungsten (TiW), titanium silicide (TiSix), or tungsten (W), may be formed before the deposition of the aluminum alloy.

Figure 2C:
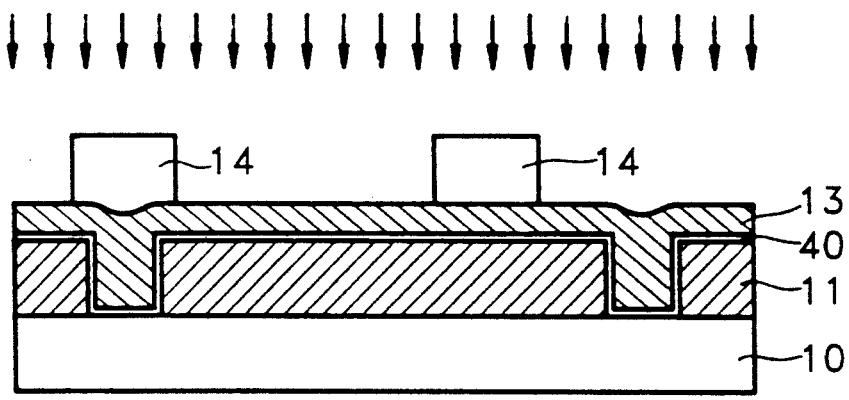

FIG. 2C illustrates the structure of the semiconductor device after the next step. By photolithography, photoresist pattern 14 is placed for masking in a first group (which accounts for about half of the total metal wires) of metal wires. If metal wires with wide widths are formed during this process, they are less affected by a succeeding etching process than metal wires with narrower widths.

Figure 2D:
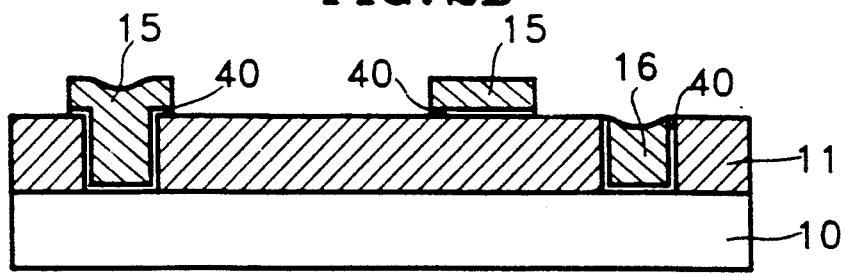

FIG. 2D shows the result of etching, with photoresist pattern 14 as a mask. The end of this process forms the first group of the metal wires 15. In addition, metal 16 fills contact holes 12.

Figure 2E:
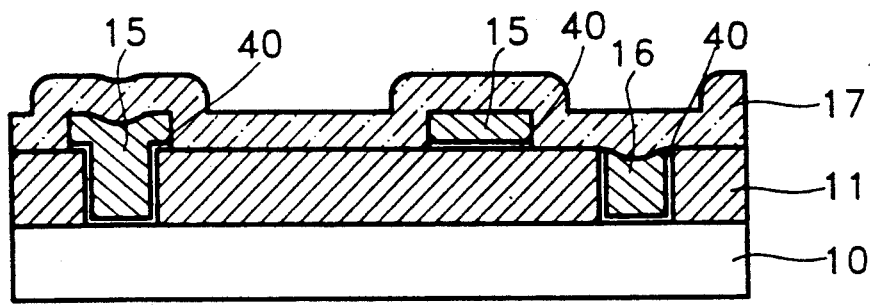

Next, second insulating layer 17 of a compound such as silicide nitride (SixNy), silicide oxide nitride (SixOyNz), undoped silicate glass (USG), PSG, or BPSG is evenly applied over the entire surface of the structure which is obtained by the previous step. The resulting structure is shown in FIG. 2E.

Figure 2F:
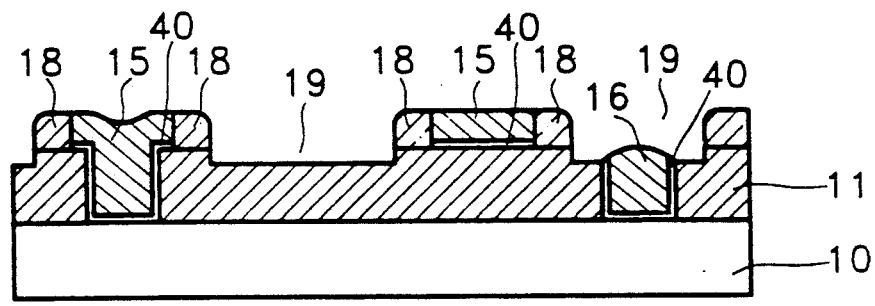

Next, second insulating layer 17 is etched through an etchback process. This procedure forms sidewall spacers 18, on the side walls of the first group of metal wires 15, as shown in FIG. 2F. During this process, second insulating layer 17 is preferably overetched, so that grooves 19 between metal wires 15 are cut deeper than the bottom of metal wires 15. Later, grooves 19 will be filled with the second group of metal wires. It is noted that uneven depths of two adjacent metal wires will decrease parasitic capacitances between the adjacent wires.

Figure 2G:
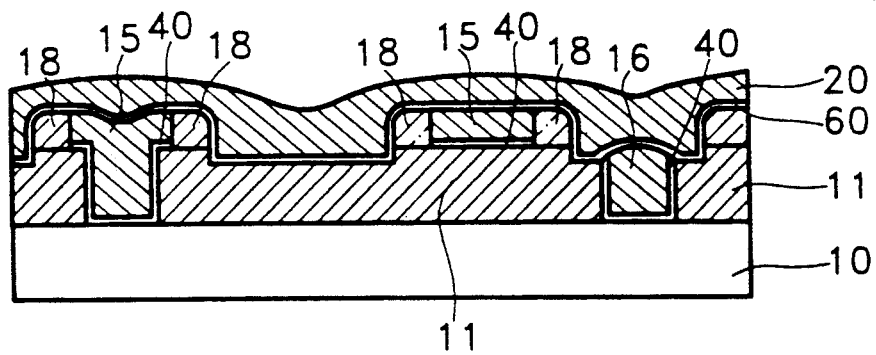

FIG. 2G shows the result of depositing an aluminum alloy via sputtering or the CVD method, thus completely filling in grooves 19. Barrier layer 60, which is similar to the above described barrier layer 40, may be formed before the deposition of aluminum alloy material. This forms second metal layer 20.

Second metal layer 20 is then etched through an etchback process, so that the second group of metal wires 21 is formed within grooves 19. This is shown in FIG. 2H.

Figure 2H:
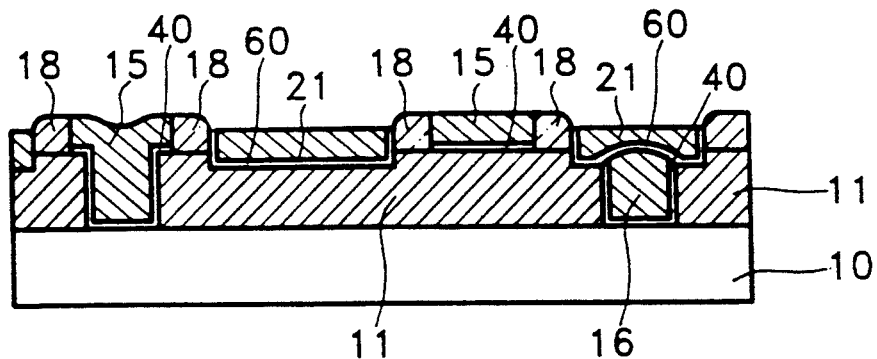
Figure 2I:
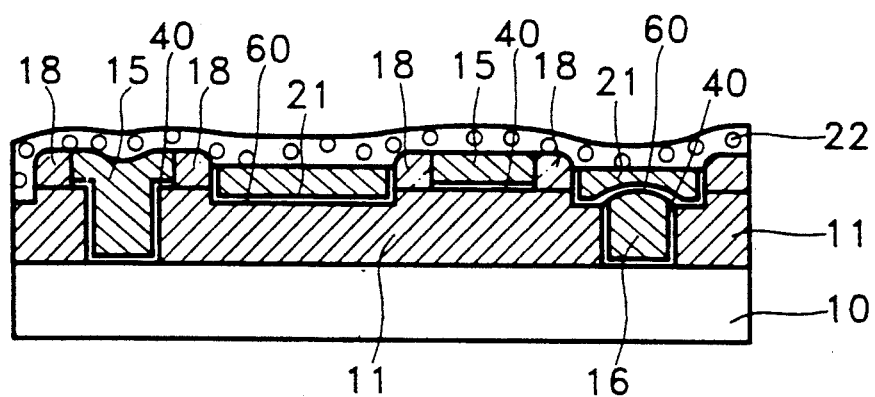

The metal wiring process is concluded when third insulating layer 22, which may be of the same material as side wall spacers 18, is blanketed over the top of the previous structures in FIG. 2H. The surface of third insulating layer 22 is relatively planar, as indicated in FIG. 2I.

In the preceding process for forming metal wires, since sidewall spacers 18 are formed between metal wires 21 and 15, it is possible to construct relatively planar surface after adding third insulating layer 22. In addition, the preceding process avoids the formation of voids 23.

It is noted that photolithography is performed only once in the present invention, as in the conventional metal wiring process. When the second group of metal wires 21 are formed, the wires 21 tend to align themselves properly relative to the first group of metal wires 15, 16.

It is also noted that the spacing between two adjacent metal wires may be narrowed to about 0.1 microns by merely adjusting the width of sidewall spacers 18.

Although only one embodiment of this invention has been described in detail above, those skilled in the art will readily appreciate that many modifications are possible in the preferred embodiment without materially departing from the novel teachings and advantages of this invention. Accordingly all such modifications are intended to be included within the scope of this invention as defined by the following claims.

What is claimed is:

1. A method of wiring a semiconductor device, comprising the steps of:
    (1) forming a first insulating layer on a semiconductor substrate;
    (2) forming contact holes in said first insulating layer;
    (3) forming a first smooth metal layer on the entire surface of said first insulating layer, the first smooth metal layer completely filling said contact holes;
    (4) forming a first group of metal wires by applying a photolithographic process to said first smooth metal layer, each wire of the first group being arranged at regular intervals;
    (5) forming sidewall insulating spacers on side surfaces of each wire of said first group of metal wires and etching said first insulating layer between said sidewall spacers to an even depth;
    (6) forming a second smooth metal layer on the entire surface of the structure which results from step (5), the second smooth metal layer completely filling spaces between said sidewall spacers; and
    (7) forming a second group of metal wires on said spaces between said sidewall spacers by anisotropically etching said smooth second metal layer, the second group of metal wires being insulated from said first group of metal wires by said sidewall spacers.

2. A method for wiring as in claim 1, wherein each of steps (3) and (6) comprises sputtering.

3. A method for wiring as in claim 1, wherein each of steps (3) and (6) comprises chemical vapor deposition process.

4. A method for wiring as in claim 1, wherein each of steps (3) and (6) comprises the step of depositing aluminum.

5. A method for wiring as in claim 1, wherein each of steps (3) and (6) comprises the step of depositing an aluminum alloy including aluminum and one of Si, Cu, Ti, Pd, Hf, and B.

6. A method for wiring as in claim 1, wherein each of steps (3) and (6) comprises the steps of:
    forming a barrier layer; and
    forming an aluminum layer on the top of said barrier layer.

7. A method for wiring as in claim 6, wherein forming said barrier layer comprises the step of layering one of Ti/TiN, MoSix, TiW, TiSix, and W.

8. A method for wiring as in claim 1, wherein each of steps (3) and (6) comprises the steps of:
    forming a barrier layer; and
    forming an aluminum alloy layer on the top of said barrier layer.

9. A method for wiring as in claim 8, wherein forming said barrier layer comprises the step of layering one of Ti/TiN, MoSix, TiW, TiSix, and W.

10. A method for wiring as in claim 1, wherein step (5) comprises the step of forming sidewall spacers comprising one of SixNy, SixOyNz, USG, PSG, and BPSG.

11. A method for wiring as in claim 1, wherein step (5) comprises the steps of:
    depositing said second insulating layer on the entire surface of the structure resulting from step (4), the depositing step including a plasma low-temperature deposition process; and
    etching said second insulating layer by an etchback method.

12. A method for wiring as in claim 1, wherein step (5) comprises the steps of:

depositing said second insulating layer on the entire surface of the structure resulting from step (4), the depositing step including an atmospheric-pressure CVD method; and etching said second insulating layer by an etchback method.

13. A method for wiring as in claim 1, wherein said sidewall insulating spacers of step (5) are formed having a width which is thicker than 0.1 microns.

14. A method for forming wires on a semiconductor device, comprising the steps of:

forming a first group of metal wires, each wire arranged at a given interval from wires which are adjacent to said each wire;

forming sidewall spacers comprising an insulating material on side surfaces of each wire of said first group of metal wires using an etchback method; and forming a second group of metal wires, each wire of the second group being placed in a spacing between two adjacent metal wires of said first group using an etchback method, the second group of metal wires being aligned to said first group of metal wires, each wire of the second group being separated form each wire of the first group by said sidewall spacers.

* * * * *